US011035725B2

(12) United States Patent
Katz et al.

(10) Patent No.: US 11,035,725 B2
(45) Date of Patent: Jun. 15, 2021

(54) SENSING DEVICE COMPRISING ELECTRICAL COMPONENTS OF HIGH VOLTAGE DOMAIN AND LOW VOLTAGE DOMAIN TO PERFORM QUENCHING OF A SINGLE PHOTON AVALANCHE DIODE

(71) Applicant: Technion research and development foundation, Haifa (IL)

(72) Inventors: Alexander Katz, Binyamina (IL); Yael Nemirovsky, Haifa (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 0 days.

(21) Appl. No.: 16/787,035

(22) Filed: Feb. 11, 2020

(65) Prior Publication Data
US 2020/0284652 A1 Sep. 10, 2020

Related U.S. Application Data

(60) Provisional application No. 62/804,839, filed on Feb. 13, 2019.

(51) Int. Cl.
*G01J 1/44* (2006.01)
*G01J 1/46* (2006.01)
*H01L 31/107* (2006.01)
*H01L 31/02* (2006.01)

(52) U.S. Cl.
CPC .......... *G01J 1/46* (2013.01); *H01L 31/02005* (2013.01); *H01L 31/02027* (2013.01); *H01L 31/107* (2013.01); *G01J 2001/4466* (2013.01)

(58) Field of Classification Search
CPC ........ G01J 1/46; G01J 2001/4466; G01J 1/44; G01J 2001/442; H01L 31/02027; H01L 31/107; H01L 27/14649
USPC .......................................... 250/214 R, 214.1
See application file for complete search history.

(56) References Cited

U.S. PATENT DOCUMENTS 7,897,906 B2 *  3/2011  Deschamps ............ H03K 17/78
                                                250/214 R

* cited by examiner

*Primary Examiner* — Que Tan Le
(74) *Attorney, Agent, or Firm* — Reches Patent (57) ABSTRACT

A sensing device that may include a substrate; a single-ended SPAD; first electrical components; second electrical components; and capacitors. The SPAD, the first electrical components and the second electrical components are formed on the substrate. The SPAD and the first electrical components belong to a high voltage domain of the sensing device. The high voltage domain is configured to receive a high supply voltage that exceeds a breakdown voltage of the SPAD. The second electrical components belong to a low voltage domain of the sensing device. The capacitors are coupled between the low voltage domain and the high voltage domain. The first electrical components and the second electrical components belong to an electrical circuit that is configured to perform quenching of the SPAD.

24 Claims, 5 Drawing Sheets

SENSING DEVICE COMPRISING ELECTRICAL COMPONENTS OF HIGH VOLTAGE DOMAIN AND LOW VOLTAGE DOMAIN TO PERFORM QUENCHING OF A SINGLE PHOTON AVALANCHE DIODE

BACKGROUND

A single photon avalanche diode (SPAD) is a highly sensitive detector that are capable of detecting a single photon.

A dual-ended SPAD has an anode that is electrically isolated from a substrate on which the anode is formed. The isolation is provided by introducing an intermediate region between the substrate and the anode. The intermediate region has a type of doping (N-type or P-type) that differs from a type of doping of the substrate (P-type or N-type, respectively). For example—a P-type anode may be surrounded by a deep N-well region.

The dual ended SPAD has limited sensitivity in the near infrared region.

There is a growing need to provide a sensing device with a high sensitivity in the near infrared region.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a module capable of executing the method.

Any reference in the specification to a module should be applied mutatis mutandis to a method that may be executed by the module.

The term "substantially"—unless stated otherwise may refer to a deviation of few percent (for example—deviation of less than ten percent or less than 20 percent).

There may be provided a compact and high sensitivity sensing device.

The high sensitivity is obtained, at least in part, by using a SPAD that has a node that is not isolated from the substrate. The anode of the SPAD and the substrate have a same type of doping.

This SPAD is also referred to a single-ended SPAD—or a SPAD that has a common anode.

In order to achieve a compact detection device—and especially, to increase the fill factor of the sensing device—the SPAD and various electrical components are formed on the same substrate. This implementation requires the anode of the SPAD to be grounded.

The grounding of the anode of the SPAD requires to supply a high supply voltage Vap (that exceeds the breakdown voltage of the SPAD) to the SPAD and to first electrical components of the sensing device.

Second electrical components of the sensing device are formed within a low voltage domain that is configured to receive at least one low supply voltage that is lower than a breakdown voltage of the SPAD. The low supply voltage may be smaller than $\frac{1}{2}$, $\frac{1}{3}$, $\frac{1}{4}$, $\frac{1}{5}$ (and even lower) of the breakdown voltage of the SPAD.

Electrical components such as transistors should not be subjected to voltage difference between the high supply voltage and the low supply voltage.

Accordingly—the low voltage domain should be direct current (DC) isolated from the high voltage domain.

The DC isolation can be obtained, and the compactness of the sensing device may be maintained, by using capacitors such as but not limited to Metal Insulator Metal (MIM) capacitors.

The sensing device may include (a) a substrate, (b) a SPAD having a cathode and an anode, (c) first electrical components, (d) second electrical components, and (e) capacitors.

The SPAD, the first electrical components and the second electrical components are formed on the substrate.

The SPAD and the first electrical components belong to a high voltage domain of the sensing device.

The high voltage domain is configured to receive a high supply voltage that exceeds a breakdown voltage of the SPAD.

The second electrical components belong to a low voltage domain of the sensing device.

The low voltage domain is configured to receive at least one low supply voltage that is lower than a breakdown voltage of the SPAD.

The capacitors are coupled between the low voltage domain and the high voltage domain.

The first electrical components and the second electrical components belong to an electrical circuit that is configured to perform quenching of the SPAD.

The high supply voltage (Vap) may substantially equal a sum of a breakdown voltage (Vbd) of the SPAD and an access voltage (Vex). One (Vdd) of the at least one supply voltages may substantially equal the access voltage.

The first electrical components may include a first group of transistors, wherein the transistors of the first group of transistors are surrounded by a doped region having a doping of a type that differs from the type of doping of the substrate.

The first electrical components may include a first transistor that may be electrically coupled to the cathode of the SPAD.

The first transistor may be configured to operate as a passive quenching resistor when the electrical circuit is disabled from performing active quenching.

The first electrical components may include a second transistor that may be configured to reset the SPAD during a completion of an active quenching of the SPAD.

The first electrical components may include a third transistor that may be configured to operate as a pull up resistor of a gate of the second transistor and to keep the second transistor in an off state when the SPAD may be idle.

The third transistor had a gate oxide that may be thicker than a gate oxide of the first transistor. This allows the third transistor to maintain closed and act as a resistor even when the second transistor is opened.

The second electrical components may include (a) a comparator that may be configured to sense a breakdown of the SPAD and generate a detection signal, (b) and one or more additional second electrical components that are configured to generate, in response to the detection signal, a control signal for resetting the SPAD.

The one or more additional second electrical components may include an adjustable resistance transistor that may be configured to determine a response period of an active quenching operation of the electrical circuit.

The second electrical components may include multiple inverters, and multiple transistors.

Figure 1:
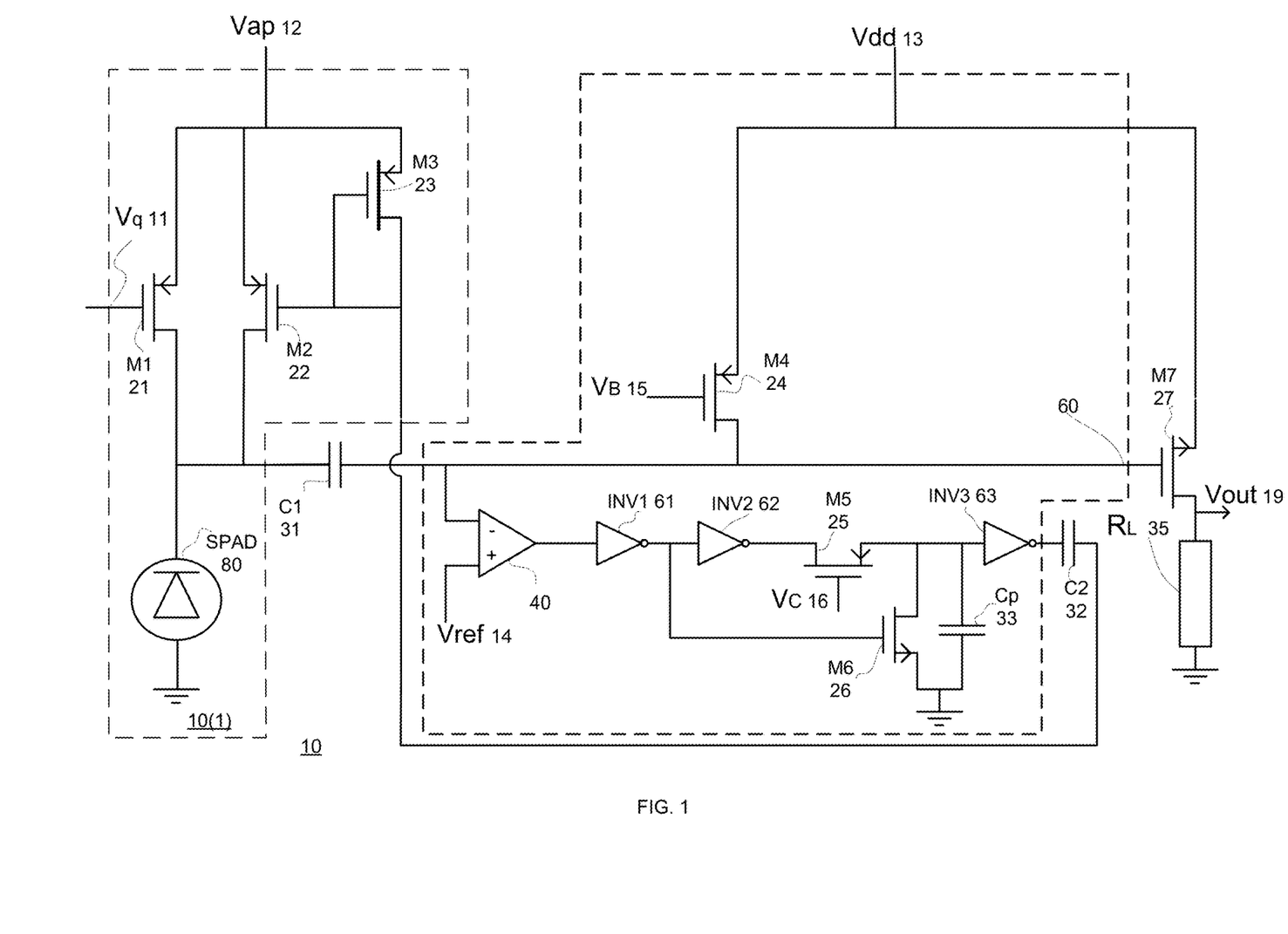
FIG. 1 illustrates an example of a sensing device.

FIG. 1 illustrates an example of a sensing device 10. The sensing device includes a high voltage region 10(1), a low voltage region 10(2), and capacitors (such as first capacitor C1 31 and second capacitor C2 32) coupled between the low voltage region and the high voltage region.

Sensing device 10 includes a single ended SPAD 80 having a grounded anode. The cathode of SPAD 80 is coupled to a drain of first transistor M1 21, to a drain of second transistor M2 22, and to a first plate of first capacitor C1 31.

The source of M1 21, M2 22 and third transistor M3 23 are coupled to a high voltage port for receiving high supply voltage Vap 12. The gate and drain of M3 23 are coupled to the gate of M2 and to a second plate of second capacitor C2 32.

The second plate of C1 31 is coupled to an output port 60 of the sensing device 10, to a drain of a fourth transistor M4 24, and to a negative port of comparator 40.

A source of M4 is coupled to a low voltage port for receiving low supply voltage Vdd 13.

A positive port of comparator 40 is configured to receive reference voltage Vref 14.

An output port of comparator 40 is coupled to an input of first inverter INV1 61. An output of INV1 61 is coupled to an input of second inverter INV2 62 and to a gate of sixth transistor M6 26. The source and drain of fifth transistor M5 25 are coupled between the output of INV2 62 and the input of third inverter INV3 63. The drain of M6 26 is grounded.

The source of M6 26 is coupled to an input of INV3 63. An output of INV3 63 is coupled to a first plate of C2.

FIG. 1 also illustrates a seventh transistor M7 27, and a load resistor R1 35 that are coupled to the output of sensing device 10. They may not be parts of sensing device 10 and may be replaced by other components. In FIG. 1, M7 27 outputs an output voltage (Vout) 19.

The high supply voltage Vap 12 may equal a sum of Vbd and Vex.

Transistors M1 21, M2 22 and M3 may be surrounded by a dedicated N-well region (when a P-type substrate is used) that may be fed with Vap. Vbd is the SPAD's breakdown voltage and may be, for example, about 20 Volts, below 20 Volts or above 20 Volts. Vdd may be about 1.8 Volts, below 1.8 volts or above 1.8 volts.

The comparator 40 may be fed with a low supply voltage of 3.3 Volts. The gate of M1 21 is controlled by first control voltage Vq 11. M1 21 may act as a quenching (controlled) resistor and thus after an avalanche event, M1 21 quenches, and then passively resets SPAD 80 (if active-reset is inactivated—for example of the time constant set by M5 25 exceeds the time constant of the passive reset). The passive SPAD's pulse duration can be selected by the first control voltage Vq 11.

High supply voltage Vap 12 and first control voltage Vq 11 are applied to the source and gate of M1 21, but the difference between them should not exceed a MOSFET oxide breakdown. Due to this fact, both voltages should be raised up simultaneously. If a resistor is used instead of M1 21, Vq is not applied. A resistor may be larger than M1 21 and thus may reduce the fill factor of the sensing device.

It may be beneficial to change Vap 12 (for example during a power up process) in a gradual manner (for example during a time period of few milliseconds)—to prevent a transient drop between the drains of $M_1$, $M_2$, $M_3$ and the other terminals of the sensing device.

C1 31 performs alternate current (AC) coupling and direct current (DC) separation of the DC levels of the high voltage domain and the low voltage domain. C1 31 may be as small as possible from an area perspective, but with high enough value relative to the comparator input parasitic capacitance, in order to allow acceptable voltage swing at the comparator input. For example—C1 31 may be a Metal Insulator Metal (MIM) capacitor—or a capacitor that differs from a MIM capacitor.

M3 23 is diode-connected and acts as a pull-up transistor for the gate of M2 22, thereby keeping M2 22 in an "off" state when SPAD 80 is in "idle" (does not detect a photon, and after being quenched).

M4 24 defines a bias voltage (equals to Vdd 13) on the second $C_1$ plate for the 1.8 V logic domain.

When a photon hits SPAD 80 and causes an avalanche event, an inverted pulse is generated on its cathode. This pulse is coupled to the negative input of comparator 40 and compared (by the comparator) to Vref 14. If a breakdown event is identified, the comparator 40 and the series of inverters (INV1 61, INV2 62 and INV3 63) (ignoring, for simplicity of explanation, M5 25, M6 26 and Cp 33—which is the parasitic capacitance M6 26) drive an inverted pulse coupled through C2 32 to the gate of M2 22, which in turn resets SPAD 80 to Vap 13.

M5 25 is an NMOS transistor has a drain source resistance ($R_{DS\_ON}$) that, in addition to Cp 33 form an RC delay, controlled by Vc 16—to provide a controlled active quenching period—for example within a range of 1 nano seconds to up to a few milliseconds.

M6 26 is an NMOS transistor. M6 26 resets Cp 33 to ground during the SPAD's idle time.

C2 32 may be as small as possible from an area perspective, but with high enough value relative to the comparator input parasitic capacitance, in order to allow acceptable voltage swing at the comparator input. For example—C2 32 may be a MIM capacitor—or a capacitor that differs from a MIM capacitor.

M3 23 is diode connected and operates as a resistor. M3 23 may be a thick-oxide (for example a thick-oxide 3.3 V diode-connected transistor) that is maintained closed—and during the reset of SPAD 80 is used as a load for the switching pulse, taking advantage of its resistance (it may not open), even under 1.8 V inverted pulse swing.

A test sensing device had electrical circuit that had a size of about 37 μm×37 μm (excluding the SPAD), while the SPAD has a size of 25 μm×25 μm. These values are merely an example.

Figure 2:
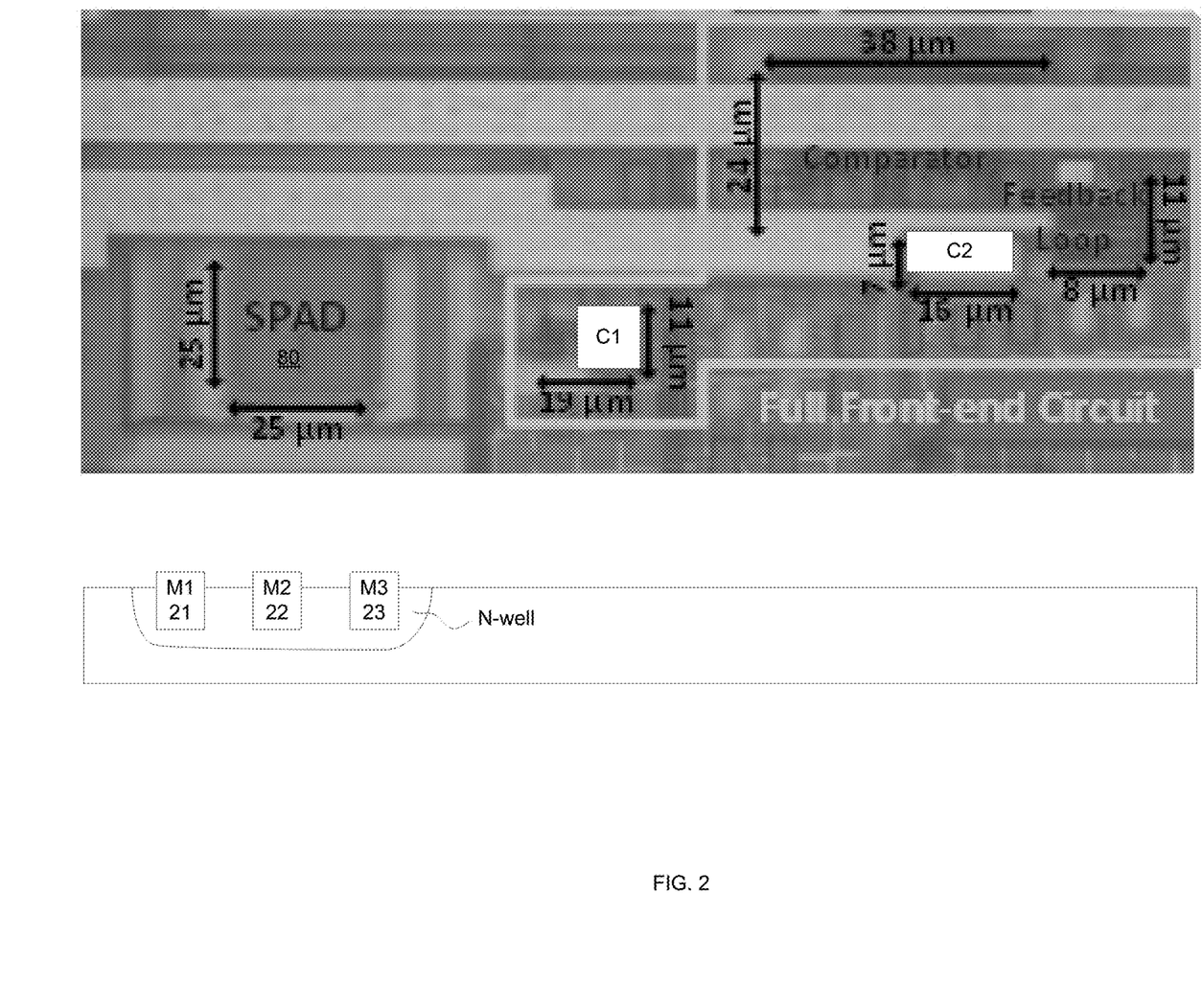
FIG. 2 illustrates an example of a sensing device.

FIG. 2 illustrates a top view of sensing device 10 and a cross section of part of the sensing device that illustrated that M1 21, M2 22 and M3 23 are surrounded by an N-well region, other transistors may be surrounded by other N-wells.

Figure 3:
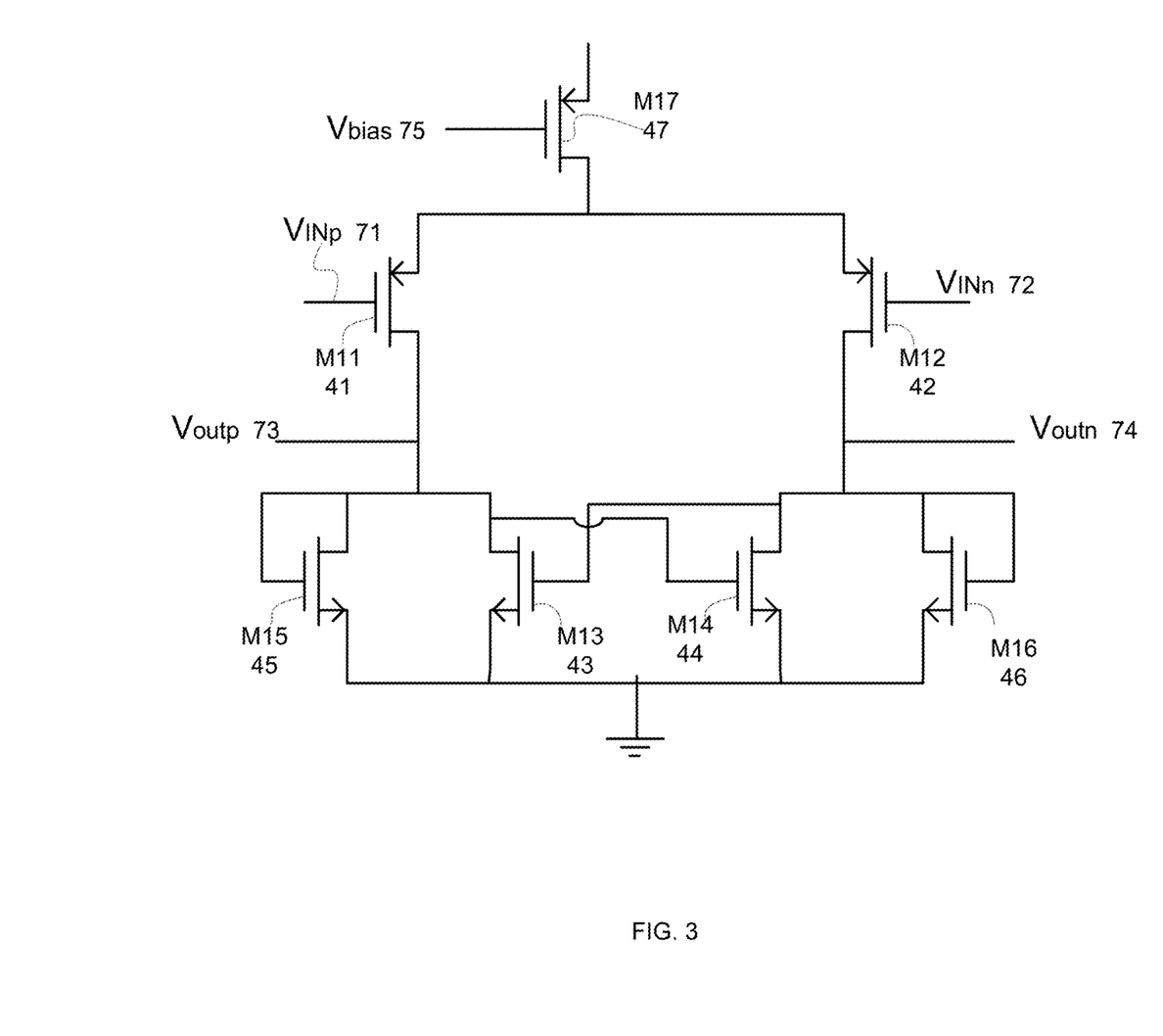
FIG. 3 illustrates an example of a comparator.

FIG. 3 illustrates an example of a comparator 40.

Comparator 40 may perform the comparison between Vref and the voltage of the cathode of the SPAD very quickly—for example during a comparison period that is smaller than one nanosecond—especially during a period that does not exceed a passive quenching duration.

The comparator includes eleventh till seventeenth transistors M11—M17 41-47, a positive input transistor VINp 71 and a negative input transistor VINn 72. The comparator may include a positive output port (for outputting Voutp 73) and a negative output port (for outputting Voutn 74), both or only one of these output ports may be used, both output ports may be coupled to an any circuit (for example averaging circuit) for outputting a single output voltage. For example, in FIG. 1 only the positive output port is coupled to INVR 1 while the negative output port is not coupled to any part of the sensing circuit. M17 47 is a current source and Vbias 75 controls the DC current that flow through M17 47.

A sum of all capacitances on the positive and negative output ports may be, for example, about 15 fF and a transconductance of M13 43 and M14 44 may be is about 1 mS. Other values may be provided.

Accordingly, the estimated comparator speed is in the order of hundreds of picoseconds. It allows the adequate response prior to the end of the passive quenching phase.

A current source implemented in the comparator avoids peak current during commutations and increases the power supply rejection ratio (PSRR). To improve the timing performance of the circuit, an NMOS cross-coupled pair structure (M13 43 and M14 44) was chosen. The circuit consists of a differential PMOS transistors input pair (M11 41 and M2 42) and load of four transistors (M13, M14, M15 M16). The cross-coupled pair is useful to completely unbalance the output voltage in the presence of very small input signals. The two diode connected transistors (M15 45 and M16 46) fix the output low voltage and output high voltage and reduce the positive feedback gain of the cross-coupled pair, which otherwise would be too large and would lead to a fixed output voltage. A biasing current of the comparator has been set to 210 μA and it is the only DC power consumer in the circuit.

Figure 4:
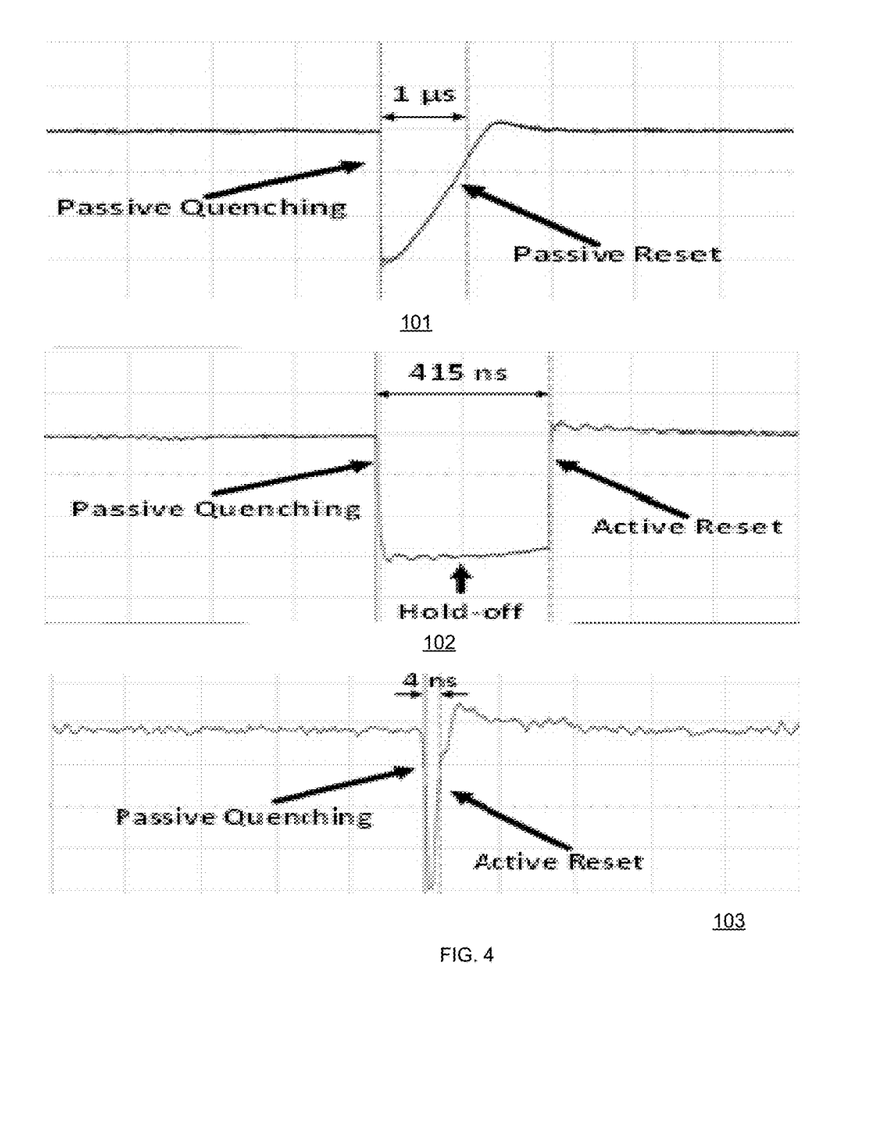
FIG. 4 illustrates an example of a waveforms.

FIG. 4 illustrates first waveform 101, second waveform 102 and third waveform 103. These waveforms are out of scale and were obtained while testing a test sensing device. The measurement was conducted with Keysight N2796A active probe (2 GHz bandwidth at −3 dB) and DSO9104A oscilloscope (1 GHz analog bandwidth at −3 dB). The voltage pulses on the $V_{out}$ node of the sensing device were probed. First waveform 101 represents a typical dead time pulse shape without an active-reset activation (programmable delay longer than SPAD pulse duration). Second waveform 102 represents a pulse shape with the active-reset activation and hold-off time (programmable delay shorter than SPAD pulse duration). Third waveform 103 represents a minimal 4 ns measured pulse that was affected by the source follower (includes M7 and R1) limited bandwidth, due to the package and setup high reactive load.

There may be provided a method for operating the device—for example by sensing photons and performing a quenching.

Figure 5:
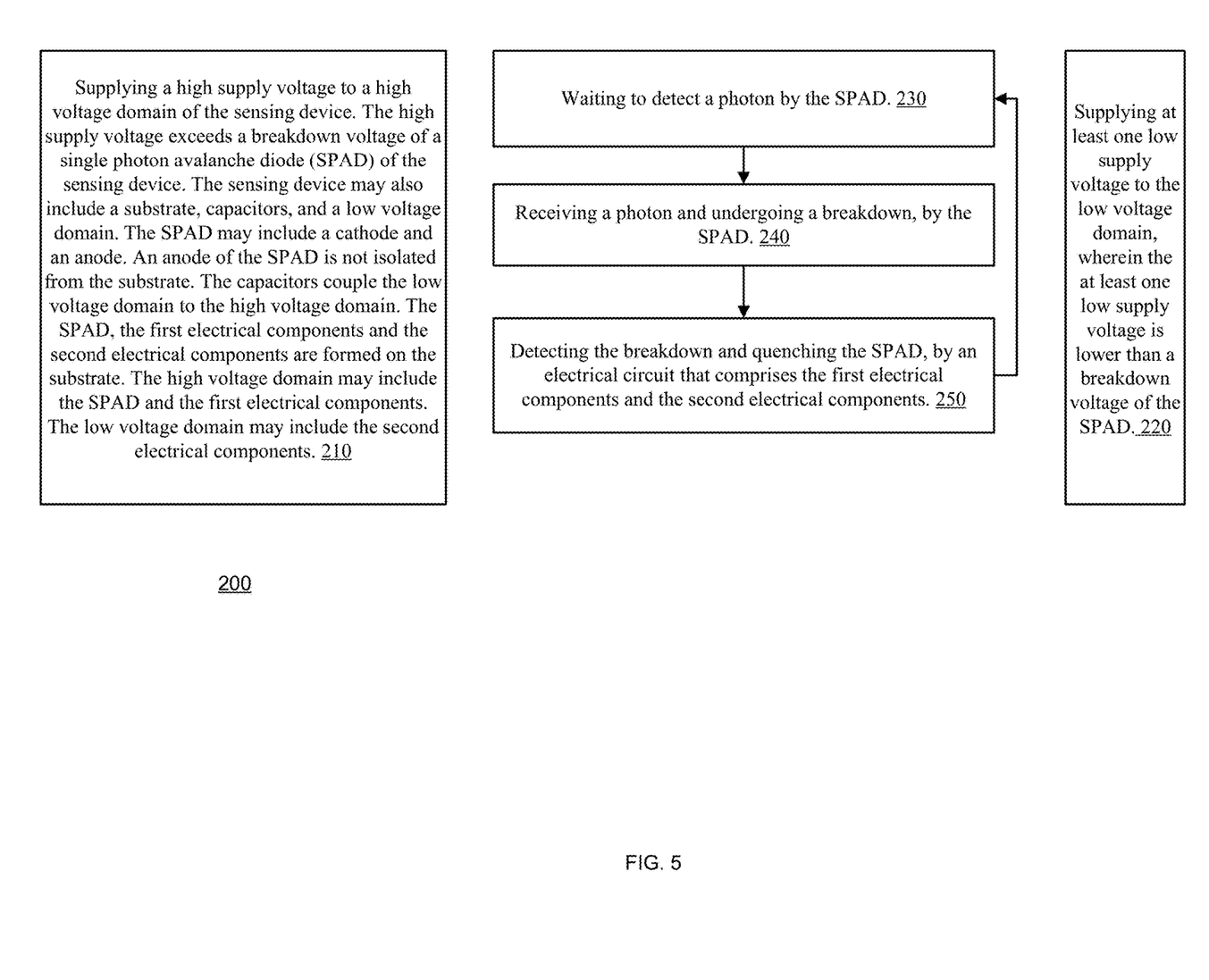
FIG. 5 illustrates an example of a method.

FIG. 5 illustrates method 200 for operating a sensing device.

Method 200 may start by steps 210, 220 and 230.

Step 210 may include supplying a high supply voltage to a high voltage domain of the sensing device. The high supply voltage exceeds a breakdown voltage of a single photon avalanche diode (SPAD) of the sensing device.

The sensing device may also include a substrate, capacitors, and a low voltage domain. The SPAD may include a cathode and an anode. An anode of the SPAD is not isolated from the substrate. The capacitors couple the low voltage domain to the high voltage domain. The SPAD, the first electrical components and the second electrical components are formed on the substrate. The high voltage domain may include the SPAD and the first electrical components. The low voltage domain may include the second electrical components.

Step 220 may include supplying at least one low supply voltage to the low voltage domain, wherein the at least one low supply voltage is lower than a breakdown voltage of the SPAD.

Step 230 may include waiting to detect a photon by the SPAD. The SPAD may be regarded idle during step 230.

Step 230 may be followed by step 240 of receiving a photon and undergoing a breakdown, by the SPAD.

Step 240 may be followed by step 250 of detecting the breakdown and quenching the SPAD, by an electrical circuit that comprises the first electrical components and the second electrical components.

Step 250 may include (a) sensing, by a comparator that belongs to the second electrical components, the breakdown of the SPAD, (b) generating by the comparator a detection signal, and (c) generating, by one or more additional second electrical components and in response to the detection signal, a control signal for resetting the DPAD.

Step 250 may be followed by step 230.

Method 200 may also include at least one out of:
a. Operating the first transistor as a passive quenching resistor when the electrical circuit is disabled from performing active quenching.
b. Resetting, by a second transistor, the SPAD during a completion of an active quenching of the SPAD.
  i. Operating a third transistor as a pull up resistor of a gate of the second transistor and keeping the second transistor in an off state when the SPAD is idle.

Adjusting a resistance value of the adjustable resistance transistor thereby setting a response period of an active quenching operation of the electrical circuit.

The terms "including", "comprising", "having", "consisting" and "consisting essentially of" are used in an interchangeable manner. For example—any module or chip may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A sensing device comprising:
a substrate;
a single photon avalanche diode (SPAD) having a cathode and an anode; wherein an anode of the SPAD is not isolated from the substrate;
first electrical components;
second electrical components;
capacitors;
wherein the SPAD, the first electrical components and the second electrical components are formed on the substrate;
wherein the SPAD and the first electrical components belong to a high voltage domain of the sensing device; wherein the high voltage domain is configured to receive a high supply voltage that exceeds a breakdown voltage of the SPAD;
wherein the second electrical components belong to a low voltage domain of the sensing device; wherein the low voltage domain is configured to receive at least one low supply voltage that is lower than a breakdown voltage of the SPAD;
wherein the capacitors are coupled between the low voltage domain and the high voltage domain;
wherein the first electrical components and the second electrical components belong to an electrical circuit that is configured to perform quenching of the SPAD.

2. The sensing device according to claim 1 wherein the high supply voltage substantially equals a sum of a breakdown voltage of the SPAD and an access voltage, wherein a low supply voltage of the at least one supply voltage equals the access voltage.

3. The sensing device according to claim 1 wherein the low supply voltage is less than one fourth of the breakdown voltage of the SPAD.

4. The sensing device according to claim 1 wherein the first electrical components comprise a first group of transistors, wherein the transistors of the first group of transistors are surrounded by a doped region having a doping of a type that differs from a type of doping of the substrate.

5. The sensing device according to claim 1 wherein the first electrical components comprise a first transistor that is electrically coupled to the cathode of the SPAD.

6. The sensing device according to claim 5, wherein the first transistor is configured to operate as a passive quenching resistor when the electrical circuit is disabled from performing active quenching.

7. The sensing device according to claim 1 wherein the first electrical components comprise a second transistor that is configured to reset the SPAD during a completion of an active quenching of the SPAD.

8. The sensing device according to claim 7 wherein the first electrical components comprise a third transistor that is configured to operate as a pull up resistor of a gate of the second transistor and to keep the second transistor in an off state when the SPAD is idle.

9. The sensing device according to claim 8 wherein the third transistor had a gate oxide that is thicker than a gate oxide of the first transistor.

10. The sensing device according to claim 1 wherein the second electrical components comprise (a) a comparator that is configured to sense a breakdown of the SPAD and generate a detection signal, (b) and one or more additional second electrical components that are configured to generate, in response to the detection signal, a control signal for resetting the SPAD.

11. The sensing device according to claim 10 wherein the one or more additional second electrical components comprise an adjustable resistance transistor that is configured to determine a response period of an active quenching operation of the electrical circuit.

12. The sensing device according to claim 1 wherein the second electrical components comprise multiple inverters, and multiple transistors.

13. A method for operating a sensing device, the method comprising:
supplying a high supply voltage to a high voltage domain of the sensing device, wherein the high supply voltage exceeds a breakdown voltage of a single photon avalanche diode (SPAD) of the sensing device; wherein the sensing device further comprises a substrate, capacitors, and a low voltage domain; wherein the SPAD comprises a cathode and an anode; wherein an anode of the SPAD is not isolated from the substrate; wherein the capacitors couple the low voltage domain to the high voltage domain; wherein the SPAD, first electrical components and second electrical components are formed on the substrate; wherein the high voltage domain comprises the SPAD and the first electrical components; wherein the low voltage domain comprises the second electrical components;
supplying at least one low supply voltage to the low voltage domain, wherein the at least one low supply voltage is lower than a breakdown voltage of the SPAD;
receiving a photon and undergoing a breakdown, by the SPAD; and
detecting the breakdown and quenching the SPAD, by an electrical circuit that comprises the first electrical components and the second electrical components.

14. The method according to claim 13 wherein the high supply voltage substantially equals a sum of a breakdown voltage of the SPAD and an access voltage, wherein a low supply voltage of the at least one supply voltage equals the access voltage.

15. The method according to claim 13 wherein the low supply voltage is less than one fourth of the breakdown voltage of the SPAD.

16. The method according to claim 13 wherein the first electrical components comprise a first group of transistors, wherein the transistors of the first group of transistors are surrounded by a doped region having a doping of a type that differs from a type of doping of the substrate.

17. The method according to claim 13 wherein the first electrical components comprise a first transistor that is electrically coupled to the cathode of the SPAD.

18. The method according to claim 17, comprising operating the first transistor as a passive quenching resistor when the electrical circuit is disabled from performing active quenching.

19. The method according to claim 13 wherein the first electrical components comprise a second transistor, wherein the method comprises resetting, by the second transistor, the SPAD during a completion of an active quenching of the SPAD.

20. The method according to claim 19 wherein the first electrical components comprise a third transistor, wherein the method comprises operating the third transistor as a pull up resistor of a gate of the second transistor and keeping the second transistor in an off state when the SPAD is idle.

21. The method according to claim 20 wherein the third transistor had a gate oxide that is thicker than a gate oxide of the first transistor.

22. The method according to claim 13 wherein the detecting the breakdown of the SPAD comprises sensing, by a comparator that belongs to the second electrical components, the breakdown of the SPAD; generating by the comparator a detection signal; and wherein the method further comprises generating, by one or more additional second electrical components and in response to the detection signal, a control signal for resetting the DPAD.

23. The method according to claim 22 wherein the one or more additional second electrical components comprise an adjustable resistance transistor; wherein the method comprises adjusting a resistance value of the adjustable resistance transistor thereby setting a response period of an active quenching operation of the electrical circuit.

24. The method according to claim 13 wherein the second electrical components comprise multiple inverters, and multiple transistors.

* * * * *